(12) United States Patent
Kitagaito et al.

(10) Patent No.: US 9,396,962 B2
(45) Date of Patent: Jul. 19, 2016

(54) ETCHING METHOD

(71) Applicant: Tokyo Electron Limited, Tokyo (JP)

(72) Inventors: Keiji Kitagaito, Miyagi (JP); Takayuki Katsunuma, Miyagi (JP); Masanobu Honda, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/626,022

(22) Filed: Feb. 19, 2015

(65) Prior Publication Data

US 2015/0243522 A1 Aug. 27, 2015

(30) Foreign Application Priority Data

Feb. 24, 2014 (JP) ................. 2014-032945
Jul. 2, 2014 (JP) ................. 2014-136543

(51) Int. Cl.

| | | |
|---|---|---|
| *H01L 21/302* | (2006.01) | |
| *H01L 21/461* | (2006.01) | |
| *B44C 1/22* | (2006.01) | |
| *C03C 15/00* | (2006.01) | |
| *C03C 25/68* | (2006.01) | |
| *C23F 1/00* | (2006.01) | |
| *H01L 21/311* | (2006.01) | |
| *C23C 2/00* | (2006.01) | |
| *H01L 21/3105* | (2006.01) | |
| *H01J 37/32* | (2006.01) | |
| *H01L 21/768* | (2006.01) | |
| *H01L 21/02* | (2006.01) | |

(52) U.S. Cl.
CPC .......... *H01L 21/31116* (2013.01); *C23C 2/006* (2013.01); *H01J 37/32091* (2013.01); *H01L 21/0217* (2013.01); *H01L 21/02164* (2013.01); *H01L 21/311* (2013.01); *H01L 21/31055* (2013.01); *H01L 21/76897* (2013.01)

(58) Field of Classification Search
None
See application file for complete search history.

(56) References Cited

U.S. PATENT DOCUMENTS

| | | | |
|---|---|---|---|
| 5,880,036 A | 3/1999 | Becker | |
| 6,265,302 B1* | 7/2001 | Lim | ................. H01L 21/76897 257/E21.507 |
| 7,708,859 B2 | 5/2010 | Huang | |
| 2002/0160125 A1 | 10/2002 | Johnson | |
| 2003/0141017 A1* | 7/2003 | Fujisato | ................... C23C 4/04 156/345.47 |
| 2005/0048789 A1 | 3/2005 | Merry | |
| 2011/0139748 A1* | 6/2011 | Donnelly | .......... H01J 37/32036 216/37 |

FOREIGN PATENT DOCUMENTS

CN 103117216 * 5/2013

OTHER PUBLICATIONS

Agarwal, et. al., "Plasma Atomic Layer Etching Using Conventional Plasma Equipment", Journal of Vacuum Science and Technology: Part A, AVS/AIP, Melville, NY, US.

* cited by examiner

*Primary Examiner* — Stephanie Duclair (74) *Attorney, Agent, or Firm* — Pearne & Gordon LLP (57) ABSTRACT

An etching method can etch a region formed of silicon oxide. The etching method includes an exposing process (process (a)) of exposing a target object including the region formed of the silicon oxide to plasma of a processing gas containing a fluorocarbon gas, etching the region, and forming a deposit containing fluorocarbon on the region; and an etching process (process (b)) of etching the region with a radical of the fluorocarbon contained in the deposit. Further, in the method, the process (a) and the process (b) are alternately repeated.

3 Claims, 7 Drawing Sheets

ETCHING METHOD

CROSS-REFERENCE TO RELATED APPLICATION

This application claims the benefit of Japanese Patent Application Nos. 2014-032945 and 2014-136543 filed on Feb. 24, 2014 and Jul. 2, 2014, respectively, the entire disclosures of which are incorporated herein by reference.

TECHNICAL FIELD

The embodiments described herein pertain generally to an etching method.

BACKGROUND

In manufacturing electronic devices, by performing an etching process on a silicon oxide film serving as an insulating layer, holes or trenches are formed therein. In etching the silicon oxide film, generally, a target object is exposed to plasma of a fluorocarbon gas, so that the silicon oxide film is etched as described in Patent Document 1.

In the etching process with plasma of the fluorocarbon gas, the silicon oxide film is etched by active species of fluorine. Further, in the etching process, fluorocarbon is deposited on the silicon oxide film to form a deposit thereon.

Patent Document 1: Specification of U.S. Pat. No. 7,708,859

In the etching process on the silicon oxide film as described above, a film thickness of the deposit gradually increases. The increase in the film thickness of the deposit suppresses active species capable of etching the silicon oxide film from reaching the silicon oxide film. As a result, the etching process on the silicon oxide film is stopped on the way. Accordingly, an etching rate of the silicon oxide film is decreased.

Therefore, in order to continuously perform the etching process on the silicon oxide film, a new etching method is needed.

SUMMARY

In one example embodiment, an etching method of etching a region formed of silicon oxide includes an exposing process of exposing a target object including the region to plasma of a processing gas containing a fluorocarbon gas, etching the region, and forming a deposit containing fluorocarbon on the region (hereinafter, referred as "process (a)"); and an etching process of etching the region with a radical of the fluorocarbon contained in the deposit (hereinafter, referred as "process (b)"). In the method, the process (a) and the process (b) are alternately repeated.

In this method, the region formed of the silicon oxide is etched with the plasma of the fluorocarbon gas generated in the process (a), and the deposit is formed on the region. Then, in the process (b), the region is further etched with the radical of the fluorocarbon included in the deposit. Further, in the process (b), the amount of the deposit is decreased. Therefore, by further performing the process (a), the region is further etched. By alternately repeating the process (a) and the process (b), it is possible to suppress etching of the region, i.e., a silicon oxide film, from being stopped. As a result, it is possible to continuously perform the etching of the silicon oxide film.

In the process (b) of the example embodiment, the target object may be exposed to plasma of a rare gas. That is, the deposit may be exposed to the plasma of the rare gas. In the method of this example embodiment, since ions of rare gas atoms collide with the deposit, the radical of the fluorocarbon in the deposit etches the region. Further, in the process (b) of the example embodiment, the fluorocarbon gas may not be supplied.

Furthermore, the target object may further include a region formed of silicon nitride. In accordance with this example embodiment, it is possible to etch the region formed of the silicon oxide with respect to the region formed of the silicon nitride with a high selectivity.

Moreover, the process (a) and the process (b) may be performed in a capacitively coupled plasma processing apparatus including an upper electrode. Further, the upper electrode may have an electrode plate made of silicon, and the upper electrode may be connected to a power supply configured to apply a voltage for attracting positive ions to the electrode plate. Furthermore, the voltage may be applied to the upper electrode in at least one of the process (a) and the process (b). In accordance with this example embodiment, since positive ions collide with the electrode plate, silicon is released from the electrode plate. The released silicon is bonded to the active species of fluorine within the plasma processing apparatus to reduce the amount of the active species of the fluorine. As a result, it is possible to suppress the region formed of the silicon nitride from being etched and also possible to etch the region formed of the silicon oxide with a higher selectivity.

As described above, by suppressing the etching of the silicon oxide film from being stopped, it is possible to continuously perform the etching of the silicon oxide film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 1:
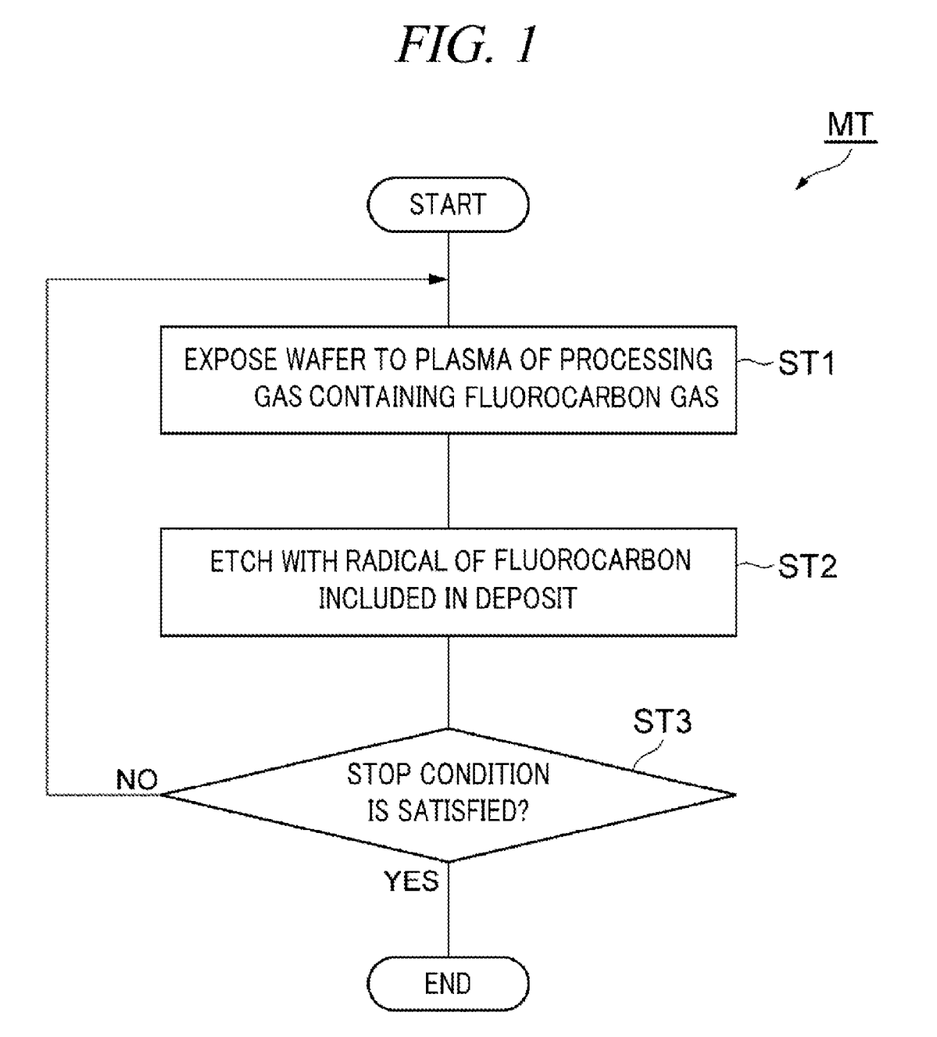
FIG. 1 is a flow chart illustrating an etching method in accordance with an example embodiment.

FIG. 1 is a flow chart illustrating an etching method in accordance with an example embodiment. A method MT illustrated in FIG. 1 is a method of etching a region formed of silicon oxide. In the example embodiment, the method may be performed on a target object (hereinafter, referred to as "wafer W") including a first region formed of silicon oxide and a second region formed of silicon nitride.

Figure 2:
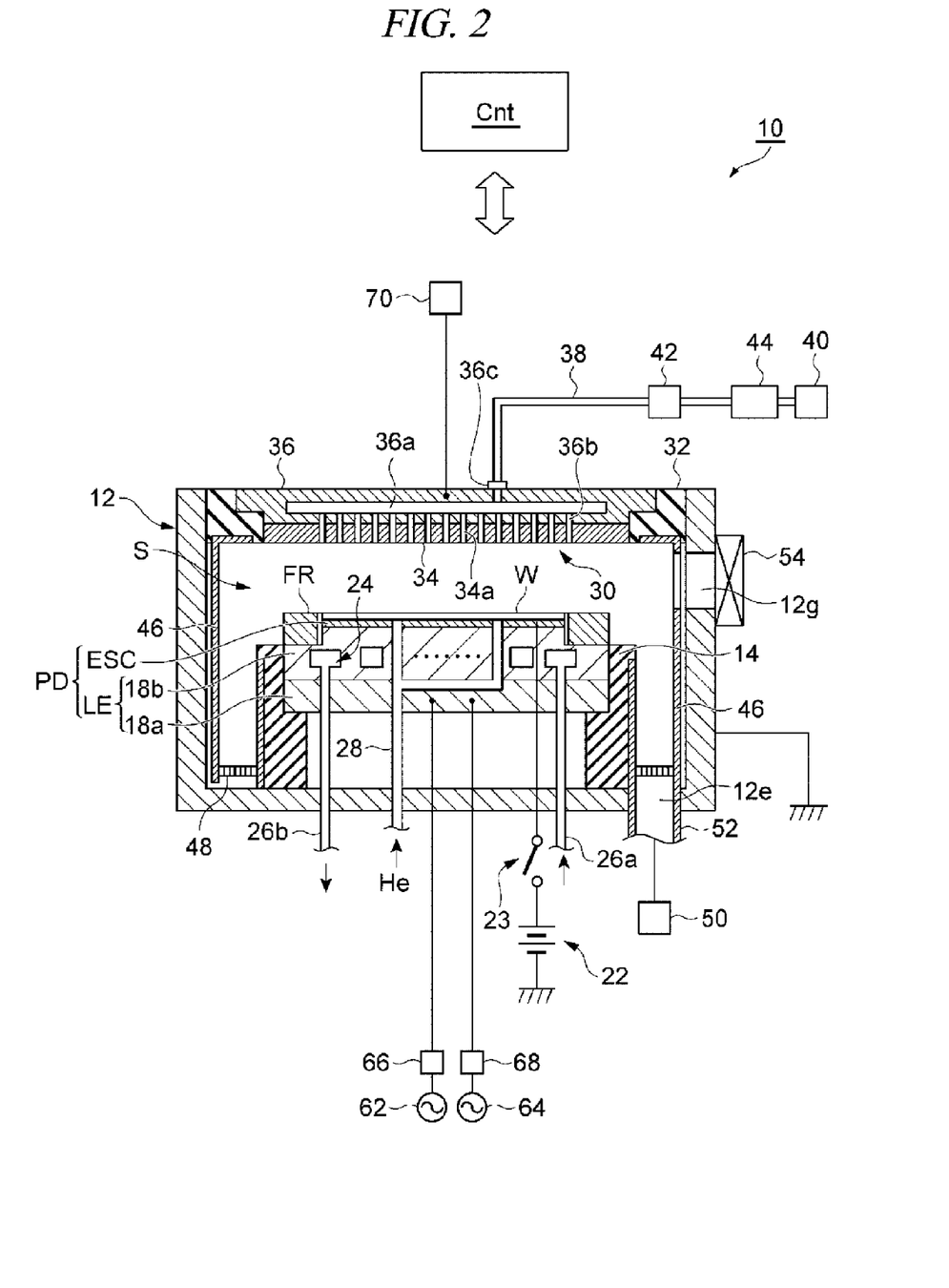
FIG. 2 is a diagram illustrating a plasma processing apparatus in accordance with the example embodiment.

Hereinafter, a plasma processing apparatus configured to perform the method MT will be described before the method MT shown in FIG. 1 is described in detail. FIG. 2 is a diagram illustrating the plasma processing apparatus in accordance with the example embodiment. A plasma processing apparatus 10 illustrated in FIG. 2 is configured as a capacitively coupled plasma etching apparatus and includes a substantially cylindrical processing chamber 12. An inner wall surface of the processing chamber 12 is formed of, for example, anodically oxidized aluminum. The processing chamber 12 is frame-grounded.

A substantially cylindrical supporting member 14 is provided on a bottom portion of the processing chamber 12. The supporting member 14 is formed of, for example, an insulating material. The supporting member 14 is vertically extended from the bottom portion within the processing chamber 12. Further, a mounting table PD is provided within the processing chamber 12. The mounting table PD is supported on the supporting member 14.

The mounting table PD is configured to hold the wafer W thereon. The mounting table PD includes a lower electrode LE and an electrostatic chuck ESC. The lower electrode LE includes a first plate 18a and a second plate 18b. The first plate 18a and the second plate 18b are formed of a metal such as aluminum, and each of the first plate 18a and the second plate 18b has a substantially disc shape. The second plate 18b is provided on the first plate 18a and electrically connected with the first plate 18a.

The electrostatic chuck ESC is provided on the second plate 18b. The electrostatic chuck ESC has a structure in which an electrode as a conductive film is arranged between a pair of insulating layers or insulating sheets. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage from the DC power supply 22. Thus, the electrostatic chuck ESC can hold the wafer W.

On a periphery of the second plate 18b, a focus ring FR is arranged to surround an edge of the wafer W and the electrostatic chuck ESC. The focus ring FR is provided to improve the etching uniformity. The focus ring FR is formed of a material appropriately selected depending on a material of an etching target film, and may be formed of, for example, quartz.

A coolant path 24 is formed within the second plate 18b. The coolant path 24 serves as a temperature control device. A chiller unit provided outside the processing chamber 12 is configured to supply a coolant into the coolant path 24 through a line 26a. The coolant supplied into the coolant path 24 is returned back to the chiller unit through a line 26b. As such, the coolant is supplied to be circulated through the coolant path 24. By controlling a temperature of the coolant, a temperature of the wafer W supported on the electrostatic chuck ESC is controlled.

Further, a gas supply line 28 is provided in the plasma processing apparatus 10. The gas supply line 28 is configured to supply a heat transfer gas, for example, a He gas, from a heat transfer gas supply unit into a gap between an upper surface of the electrostatic chuck ESC and a rear surface of the wafer W.

Furthermore, the plasma processing apparatus 10 includes an upper electrode 30. The upper electrode 30 is arranged above the mounting table PD to face the mounting table PD. The lower electrode LE and the upper electrode 30 are provided to be substantially parallel to each other. Between the upper electrode 30 and the lower electrode LE, there is formed a processing space S in which a plasma process is performed on the wafer W.

The upper electrode 30 is supported at an upper portion of the processing chamber 12 via an insulating shield member 32. In the example embodiment, the upper electrode 30 may be configured such that a vertical distance between the upper electrode 30 and an upper surface of the mounting table PD, i.e., a mounting surface of the wafer can be varied. The upper electrode 30 may include an electrode plate 34 and an electrode supporting body 36. The electrode plate 34 faces the processing space S, and multiple gas discharge holes 34a are formed through the electrode plate 34. The electrode plate 34 is formed of silicon in the example embodiment.

The electrode supporting body 36 detachably supports the electrode plate 34 and may be formed of a conductive material such as aluminum. The electrode supporting body 36 may have a water-cooling structure. A gas diffusion space 36a is formed within the electrode supporting body 36. From the gas diffusion space 36a, multiple gas through holes 36b communicating with the gas discharge holes 34a are extended downwards. Further, a gas inlet opening 36c for introducing a processing gas into the gas diffusion space 36a is formed at the electrode supporting body 36 and connected to a gas supply line 38.

The gas supply line 38 is connected to a gas source group 40 via a valve group 42 and a flow rate controller group 44. The gas source group 40 includes multiple gas sources such as a source of a fluorocarbon gas, a source of a rare gas, and a source of an oxygen ($O_2$) gas. The fluorocarbon gas may include at least one of, for example, a $C_4F_6$ gas and a $C_4F_8$ gas. Further, the rare gas may include at least one of various rare gases such as an Ar gas and a He gas.

The valve group 42 includes multiple valves, and the flow rate controller group 44 includes multiple flow rate controllers such as mass flow controllers. Each of the multiple gas sources belonging to the gas source group 40 is connected to the gas supply line 38 via a corresponding valve belonging to the valve group 42 and a corresponding flow rate controller belonging to the flow rate controller group 44.

Further, in the plasma processing apparatus 10, a deposition shield 46 is detachably provided along an inner wall of the processing chamber 12. The deposition shield 46 is also provided at an outer periphery of the supporting member 14. The deposition shield 46 is configured to suppress the etching by-products (deposits) from being deposited on the processing chamber 12 and may be formed by coating an aluminum member with ceramics such as $Y_2O_3$.

At a side of the bottom portion of the processing chamber 12 and between the supporting member 14 and a sidewall of the processing chamber 12, a gas exhaust plate 48 is provided. The gas exhaust plate 48 may be formed by coating an aluminum member with ceramics such as $Y_2O_3$. A gas exhaust opening 12e is formed under the gas exhaust plate 48 and at the processing chamber 12. The gas exhaust opening 12e is connected to a gas exhaust device 50 via a gas exhaust line 52. The gas exhaust device 50 includes a vacuum pump such as a turbo molecular pump and is configured to depressurize a space within the processing chamber 12 to a desired vacuum level. Further, a loading/unloading opening 12g for the wafer W is formed at the sidewall of the processing chamber 12, and is opened and closed by a gate valve 54.

The plasma processing apparatus 10 further includes a first high frequency power supply 62 and a second high frequency power supply 64. The first high frequency power supply 62 is configured to supply a first high frequency power having a frequency of 27 MHz to 100 MHz, for example, 40 MHz for plasma generation. The first high frequency power supply 62 is connected to the lower electrode LE via a matching unit 66. The matching unit 66 is configured to match output impedance of the first high frequency power supply 62 with input impedance on a load side (on a side of the lower electrode LE).

The second high frequency power supply 64 is configured to supply a high frequency power, i.e., a high frequency bias power, having a frequency of 400 kHz to 13.56 MHz, for example, 13 MHz for ion attraction into the wafer W. The second high frequency power supply 64 is connected to the lower electrode LE via a matching unit 68. The matching unit 68 is configured to match output impedance of the second high frequency power supply 64 with input impedance on the load side (on a side of the lower electrode LE).

The plasma processing apparatus 10 further includes a power supply 70. The power supply 70 is connected to the upper electrode 30. The power supply 70 is configured to apply, to the upper electrode 30, a voltage for attracting positive ions present within the processing space S into the electrode plate 34. In the example embodiment, the power supply 70 is a DC power supply that generates a negative DC voltage. In another example embodiment, the power supply 70 may be an AC power supply that generates an AC voltage having a relatively low frequency. The voltage applied from the power supply 70 to the upper electrode may be −150 V or less. That is, the voltage applied from the power supply 70 to the upper electrode 30 may be a negative voltage having an absolute value of 150 or more. If such a voltage is applied from the power supply 70 to the upper electrode 30, the positive ions within the processing space S collide with the electrode plate 34. Thus, secondary electrons and/or silicon are released from the electrode plate 34. The released silicon is bonded to active species of fluorine within the processing space S to reduce the amount of the active species of fluorine.

In the example embodiment, the plasma processing apparatus 10 may further include a control unit Cnt. The control unit Cnt is a computer including a processor, a memory unit, an input device, a display device, etc. and controls the respective components of the plasma processing apparatus 10. In the control unit Cnt, an operator may perform a command input operation for managing the plasma processing apparatus 10 using the input device, or may visually display an operation status of the plasma processing apparatus 10 using the display device. The memory unit of the control unit Cnt stores a control program for controlling various processes performed in the plasma processing apparatus 10 by the processor, or a program, i.e., a process recipe, for performing processes to the respective components of the plasma processing apparatus 10 according to a processing condition.

Hereinafter, the method MT will be described in detail with reference to FIG. 1 again. The method MT includes a process ST1 and a process ST2. The process ST1 and the process ST2 are alternately repeated to etch a silicon oxide film while suppressing etching of a region formed of silicon oxide from being stopped.

Figure 3:
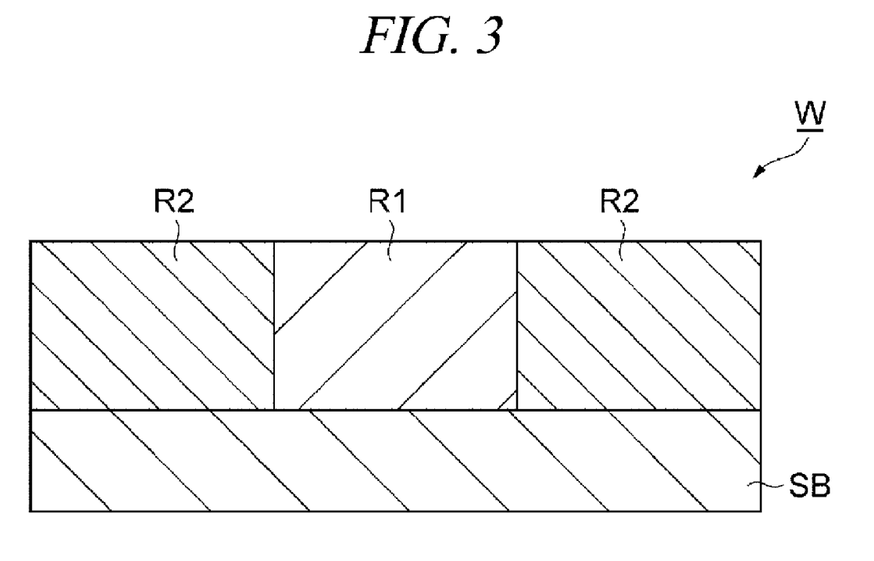
FIG. 3 is a cross-sectional view illustrating an example of a target object on which the method MT is performed.
Figure 4A:
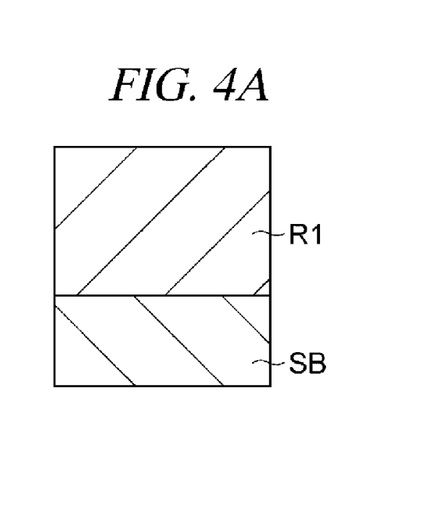
FIG. 4A to FIG. 4C are diagrams explaining processes performed to a first region in the method MT.
Figure 4B:
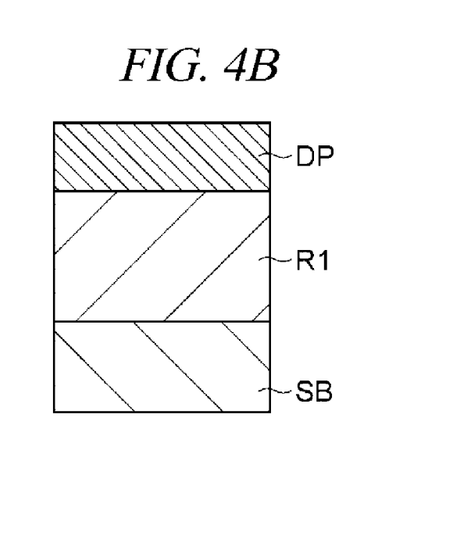
Figure 4C:
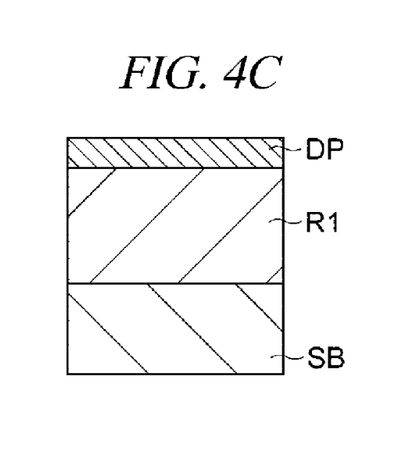
Figure 5A:
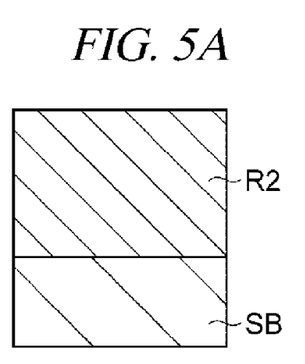
FIG. 5A to FIG. 5C are diagrams explaining processes performed to a second region in the method MT.
Figure 5B:
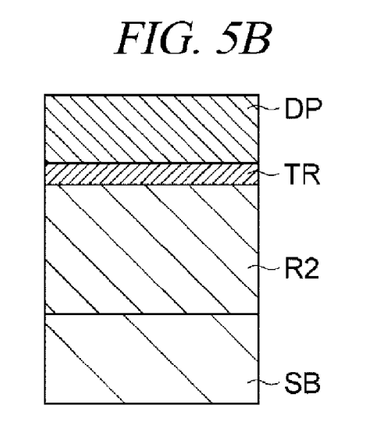
Figure 5C:
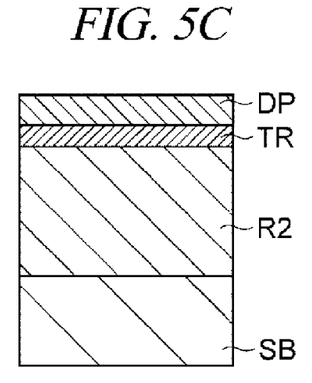

In the example embodiment, the method MT can selectively etch a partial region of the wafer W as a target object depicted in FIG. 3. To be specific, the wafer W depicted in FIG. 3 includes a substrate SB, a first region R1, and a second region R2. The substrate SB is an underlying substrate for the first region R1 and the second region R2. The first region R1 is formed of silicon oxide and the second region R2 is formed of silicon nitride. The first region R1 and the second region R2 are exposed to plasma at the same time. In the example embodiment, the method MT may be performed to selectively etch the first region R1 with respect to the second region R2. Hereinafter, assuming the wafer W depicted in FIG. 3 as a target object, the method MT will be described. Further, the following descriptions will be provided with reference to FIG. 4A to FIG. 5C. FIG. 4A to FIG. 4C are diagrams explaining processes performed to the first region in the method MT. Further, FIG. 5A to FIG. 5C are diagrams explaining processes performed to the second region in the method MT.

In the process ST1 of the method MT, the wafer W is exposed to plasma of a processing gas containing a fluorocarbon gas. The fluorocarbon gas includes at least one of, for example, a $C_4F_6$ gas and a $C_4F_8$ gas. Further, the processing gas may include at least one of various rare gases such as an Ar gas and a He gas. Furthermore, the processing gas may include an oxygen ($O_2$) gas. In the process ST1, the plasma is generated by exciting the processing gas, and the wafer W is exposed to the generated plasma.

When the process ST1 is performed in the plasma processing apparatus 10, the processing gas is supplied into the processing chamber 12 from the gas source group 40. Further, in the process ST1, the high frequency power is supplied to the lower electrode LE from the first high frequency power supply 62. Further, in the process ST1, the high frequency bias power from the second high frequency power supply 64 may be supplied to the lower electrode LE. Furthermore, in the process ST1, a pressure of the space within the processing chamber 12 is set to be a preset pressure by the gas exhaust device 50. By way of example, the pressure of the space within the processing chamber 12 is set to be in a range of 20 mTorr (2.666 Pa) to 50 mTorr (6.666 Pa). Moreover, in the process ST1, a distance between the upper electrode 30 and the upper surface of the mounting table PD is set to be in a range of 20 mm to 50 mm. Thus, plasma of the processing gas is generated within the processing chamber 12, and the wafer W mounted on the mounting table PD is exposed to the plasma. Further, in the process ST1, a voltage from the power supply 70 may be applied to the upper electrode 30. The voltage applied from the power supply 70 to the upper electrode 30 may be −150 V or less. That is, the voltage applied from the power supply 70 to the upper electrode 30 may be a negative voltage having an absolute value of 150 V or more. While the process ST1 is performed, the operations of the respective components of the plasma processing apparatus 10 can be controlled by the control unit Cnt.

At the beginning of the process ST1, active species of atoms and/or molecules generated from fluorocarbon, for example, active species of fluorine and/or fluorocarbon, collide with the first region R1 of the wafer W in a state as depicted in FIG. 4A. Thus, in the process ST1, the first region R1 is etched. Further, in the process ST1, a deposit including fluorocarbon is deposited on the first region R1. Thus, a deposit DP including fluorocarbon is formed on the first region R1. A film thickness of the deposit DP is increased as a processing time of performing the process ST1 is increased.

Further, at the beginning of the process ST1, the active species of atoms and/or molecules generated from fluorocarbon, for example, the active species of fluorine and/or fluorocarbon, collide with the second region R2 of the wafer W in a state as depicted in FIG. 5A. When the active species collide with the second region R2, a modified region TR, which has a large amount of carbon and is modified from the fluorocarbon deposit, may be formed on a surface of the second region R2. The modified region TR contains silicon and nitrogen forming the second region R2 and atoms and/or molecules included in the processing gas. By way of example, the modified region TR may contain carbon, fluorine, and oxygen included in the processing gas in addition to silicon and nitrogen. Further, in the process ST1, the deposit DP is formed on the modified region TR.

Further, if the voltage is applied from the power supply 70 to the upper electrode 30 in the process ST1, the positive ions within the processing space S collide with the electrode plate 34. Thus, silicon is released from the electrode plate 34. The released silicon is bonded to the active species of fluorine, for example, a fluorine radical and a fluorine ion, within the processing space S, so that the amount of the active species of fluorine is reduced. Thus, a forming rate of the modified region TR having a large amount of carbon is increased, and it is possible to suppress the second region R2 from being etched with the active species of fluorine. Meanwhile, the first region R1 is etched with active species of fluorocarbon in the plasma, and the deposit DP of fluorocarbon is formed on the first region R1 by the active species of fluorocarbon.

If the film thickness of the deposit DP formed through the process ST1 is increased, the deposit DP suppresses the active species capable of etching the first region R1 from reaching the first region R1. Therefore, if the process ST is continuously performed, the etching of the first region R1 is stopped. In order to suppress the etching from being stopped, the process ST2 is subsequently performed according to the method MT.

In the process ST2, the first region R1 is etched with a radical of fluorocarbon included in the deposit DP. In the process ST2 of the example embodiment, the wafer W after the process ST1 is exposed to plasma of a rare gas. A processing time for the process ST2 and a processing time for the process ST1 can be appropriately set. In the example embodiment, the processing time for the process ST1 may be set to have a ratio in a range of 30% to 70% of the total processing time for the process ST1 and the process ST2.

If the process ST2 is performed in the plasma processing apparatus 10, the rare gas is supplied from the gas source group 40. Further, in the process ST2, an oxygen gas ($O_2$ gas) may or may not be supplied together with the rare gas. Furthermore, in the process ST2, the high frequency power is applied to the lower electrode LE from the first high frequency power supply 62. Moreover, in the process ST2, the high frequency bias power from the second high frequency power supply 64 may be applied to the lower electrode LE. Further, in the process ST2, a pressure of the space within the processing chamber 12 is set to be a preset pressure by the gas exhaust device 50. By way of example, the pressure of the space within the processing chamber 12 is set to be in a range of 20 mTorr (2.666 Pa) to 50 mTorr (6.666 Pa). Furthermore, in the process ST2, a distance between the upper electrode 30 and the upper surface of the mounting table PD is set to be in a range of 20 mm to 50 mm. Thus, plasma of the rare gas is generated within the processing chamber 12, and the wafer W mounted on the mounting table PD is exposed to the plasma. Further, in the process ST2, the voltage from the power supply 70 may be applied to the upper electrode 30. The voltage applied form the power supply 70 to the upper electrode 30 may be −150 V or less. That is, the voltage applied from the power supply 70 to the upper electrode 30 may be a negative voltage having an absolute value of 150 V or more. While the process ST2 is performed, the operations of the respective components of the plasma processing apparatus 10 can be controlled by the control unit Cnt.

In the process ST2, active species of rare gas atoms, for example, ions of rare gas atoms, collide with the deposit DP. As a result, as depicted in FIG. 4C, the first region R1 is etched with the fluorocarbon radical in the deposit DP. Further, the film thickness of the deposit DP is reduced through the process ST2. Further, in the process ST2, as depicted in FIG. 5C, the film thickness of the deposit DP on the second region R2 is also reduced. However, since the modified region TR is formed on the second region R2, the etching of the second region R2 is suppressed.

Further, if the voltage is applied from the power supply 70 to the upper electrode 30 in the process ST2, the positive ions within the processing space S collide with the electrode plate 34. Thus, silicon is released from the electrode plate 34. While the process ST2 is performed, the active species of fluorine generated through the process ST1 are not completely removed but may remain within the processing chamber 12. The silicon released from the electrode plate 34 is bonded to the active species of fluorine within the processing space S to reduce the amount of the active species of fluorine. Thus, the etching of the second region R2 with the active species of fluorine is suppressed. Meanwhile, the first region R1 is etched with the radical of fluorocarbon in the deposit DP.

If the oxygen gas is not supplied in the process ST2, the first region R1 may be further etched selectively with respect to the second region R2.

In the method MT, after the process ST2, the process ST1 is performed again. Since the film thickness of the deposit DP is reduced through the process ST2, if the wafer W is exposed to the plasma of the processing gas by performing the process ST1 again, the first region R1 can be further etched. Then, since the process ST2 is further performed, the first region R1 can be further etched with the radical of fluorocarbon in the deposit DP.

In a process ST3 of the method MT, it is determined whether or not a stop condition is satisfied. It is determined that the stop condition is satisfied, for example, when the repetition number of a cycle including the process ST1 and the process ST2 reaches a preset number of times. If the stop condition is not satisfied, the cycle including the process ST1 and the process ST2 is performed again. On the other hand, if the stop condition is satisfied, the method MT is ended.

In the above-described method MT, by alternately performing the process ST1 and the process ST2 multiple times, it is possible to suppress the etching of the first region R1 from being stopped. As a result, it is possible to continuously etch the first region R1. Further, according to the method MT, the first region R1 can be selectively etched with respect to the second region R2.

Figure 6:
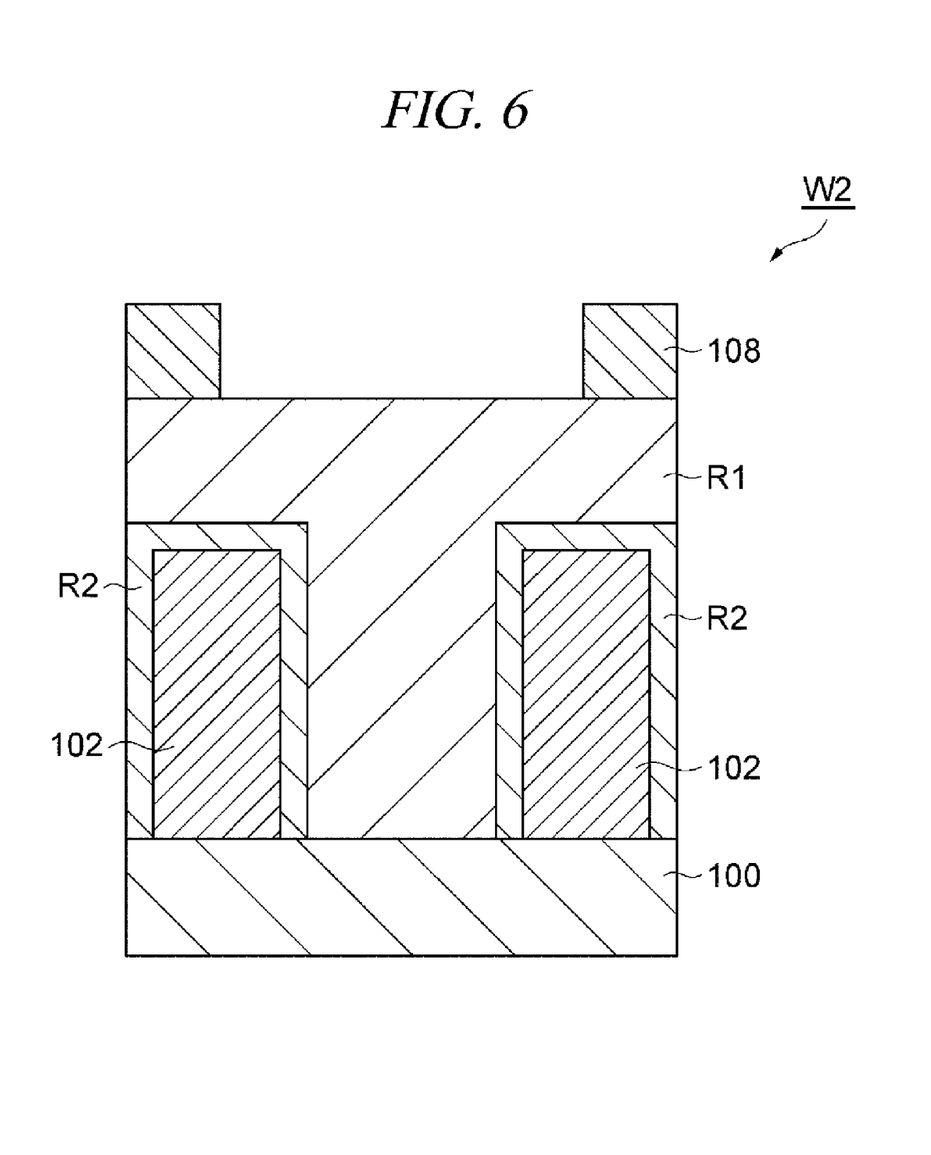
FIG. 6 is a cross-sectional view illustrating another example of a target object on which the method MT is performed.

FIG. 6 is a cross-sectional view illustrating another example of a target object on which the method MT is performed. A wafer W2 depicted FIG. 6 includes a first region R1 and a second region R2, and the method MT can be performed on the wafer W2. To be specific, the wafer W2 includes an underlying layer 100, multiple protruding regions 102, the first region R1, the second region R2, and a mask 108. The wafer W2 may be a product obtained, for example, during the manufacturing process of a fin-type field effect transistor.

The underlying layer 100 may be formed of, for example, polycrystalline silicon. In the example embodiment, the underlying layer is a fin region, and has a substantially hexahedral shape. The multiple protruding regions 102 are formed on the underlying layer 100 and arranged to be substantially parallel to one another. These protruding regions 102 may be, for example, gate regions. The second region R2 is formed of silicon nitride to cover the protruding regions 102. Further, the multiple protruding regions 102 are buried in the first region R1. That is, the first region R1 is formed to cover the protruding regions 102 via the second region R2. The first region R1 is formed of silicon oxide. The mask 108 is formed on the first region R1. The mask 108 has a pattern in which an opening is formed above and between the adjacent protruding regions 102. This mask 108 is formed of an organic film. Further, the mask 108 can be formed by the photolithography.

When the method MT is performed to the wafer W2, the first region R1 of the wafer W2 can be selectively etched with respect to the second region R2, so that a hole can be formed in a self-aligned manner between the adjacent protruding regions 102. Further, the first region R1 can be etched efficiently while suppressing the etching of the first region R1 from being stopped. Thus, the hole is extended to a surface of the underlying layer 100 through a region between the adjacent protruding regions 102. The hole may be, for example, a contact hole connected to a source or a drain in the fin region.

Hereinafter, various experimental examples conducted to evaluate the method MT will be described. The following experimental examples are provided only for illustration but do not limit the example embodiments.

Experimental Examples 1 to 4 and Comparative Experimental Example 1

In the experimental examples 1 to 4 and the comparative experimental example 1, there is prepared a wafer having a structure in which a silicon oxide chip of a square of 30 mm and a silicon nitride chip of a square of 30 mm are attached to a substrate on which a resist film is formed. These two chips are arranged at the equal distance from a center of the wafer. Processes of the experimental examples 1 to 4 and the comparative experimental example 1 are performed to the wafer under processing conditions to be described below. In the experimental example 1, a cycle including the process ST1 for 6 seconds and the process ST2 for 6 seconds is repeated 5 times. In the experimental example 2, a cycle including the process ST1 for 3 seconds and the process ST2 for 3 seconds is repeated 10 times. In the experimental example 3, a cycle including the process ST1 for 2 seconds and the process ST2 for 2 seconds is repeated 15 times. In the experimental example 4, a cycle including the process ST1 for 1 second and the process ST2 for 1 second is repeated 30 times. Further, in the comparative experimental example 1, the process ST1 is performed for 60 seconds under the following processing conditions for the process ST1.

<Processing Conditions>
Process ST1
$C_4F_6$ gas flow rate: 16 sccm
Ar gas flow rate: 1000 sccm
$O_2$ gas flow rate: 10 sccm
High frequency power from first high frequency power supply 62: 40 MHz, 500 W
High frequency bias power from second high frequency power supply 64: 13 MHz, 100 W
DC voltage from power supply 70: −300 V
Process ST2
$C_4F_6$ gas flow rate: 0 sccm
Ar gas flow rate: 1000 sccm
$O_2$ gas flow rate: 10 sccm
High frequency power from first high frequency power supply 62: 40 MHz, 500 W
High frequency bias power from second high frequency power supply 64: 13 MHz, 100 W
DC voltage from power supply 70: −300 V Experimental Examples 5 and 6 and Comparative Experimental Example 2

In the experimental examples 5 and 6 and the comparative experimental example 2, the same wafer as that in the experimental example 1 is prepared. Processes of the experimental examples 5 and 6 and the comparative experimental example 2 are performed to the wafer under processing conditions to be described below. Further, in the experimental example 5, a cycle including the process ST1 for 6 seconds and the process ST2 for 6 seconds is repeated 5 times. In the experimental example 6, a cycle including the process ST1 for 3 seconds and the process ST2 for 3 seconds is repeated 10 times. Furthermore, in the comparative experimental example 2, the process ST1 is performed for 60 seconds under the following processing conditions for the process ST1.

<Processing Conditions>
Process ST1
$C_4F_8$ gas flow rate: 8 sccm
Ar gas flow rate: 1000 sccm
High frequency power from first high frequency power supply 62: 40 MHz, 500 W
High frequency bias power from second high frequency power supply 64: 13 MHz, 100 W
DC voltage from power supply 70: −300 V
Process ST2
$C_4F_8$ gas flow rate: 0 sccm
Ar gas flow rate: 1000 sccm
High frequency power from first high frequency power supply 62: 40 MHz, 500 W
High frequency bias power from second high frequency power supply 64: 13 MHz, 100 W
DC voltage from power supply 70: −300 V Experimental Examples 7 and 8 and Comparative Experimental Example 3

In the experimental examples 7 and 8 and the comparative experimental example 3, the same wafer as that in the experimental example 1 is prepared. Processes of the experimental examples 7 and 8 and the comparative experimental example 3 are performed to the wafer under processing conditions to be described below. Further, in the experimental example 7, a cycle including the process ST1 for 6 seconds and the process ST2 for 6 seconds is repeated 5 times. In the experimental example 8, a cycle including the process ST1 for 3 seconds and the process ST2 for 3 seconds is repeated 10 times. Furthermore, in the comparative experimental example 3, the process ST1 is performed for 60 seconds under the following processing conditions for the process ST1.

<Processing Conditions>
Process ST1
$C_4F_6$ gas flow rate: 24 sccm
Ar gas flow rate: 1000 sccm O₂ gas flow rate: 10 sccm
High frequency power from first high frequency power supply 62: 40 MHz, 1000 W
High frequency bias power from second high frequency power supply 64: 13 MHz, 1000 W
DC voltage from power supply 70: −300 V
Process ST2
$C_4F_6$ gas flow rate: 0 sccm
Ar gas flow rate: 1000 sccm
O₂ gas flow rate: 10 sccm
High frequency power from first high frequency power supply 62: 40 MHz, 1000 W
High frequency bias power from second high frequency power supply 64: 13 MHz, 1000 W
DC voltage from power supply 70: −300 V Variations in film thicknesses, i.e., etched amounts, of the silicon oxide chip and the silicon nitride chip through the processes of the above-described experimental examples and the comparative experimental examples are obtained. Further, a ratio of the etched amount of the silicon oxide chip with respect to the etched amount of the silicon nitride chip, i.e., selectivity, is obtained. Table 1 shows the etched amounts and the selectivities of the two chips in the experimental examples 1 to 4 and the comparative experimental example 1; Table 2 shows the etched amounts and the selectivities of the two chips in the experimental examples 5 and 6 and the comparative experimental example 2; and Table 3 shows the etched amounts and the selectivities of the two chips in the experimental examples 7 and 8 and the comparative experimental example 3.

TABLE 1

|  | Experimental example 1 | Experimental example 2 | Experimental example 3 | Experimental example 4 | Comparative experimental example 1 |
| --- | --- | --- | --- | --- | --- |
| Etched amount (nm) of silicon oxide chip | 38.0 | 39.7 | 31.0 | 15.2 | 6.2 |
| Etched amount (nm) of silicon nitride chip | 9.3 | 7.6 | 5.9 | 4.9 | 4.4 |
| Selectivity | 4.1 | 5.2 | 5.3 | 3.1 | 1.4 |

TABLE 2

|  | Experimental example 5 | Experimental example 6 | Comparative experimental example 2 |
| --- | --- | --- | --- |
| Etched amount (nm) of silicon oxide chip | 49.2 | 47.2 | 23.7 |
| Etched amount (nm) of silicon nitride chip | 7.6 | 8.1 | 6.4 |
| Selectivity | 6.5 | 5.8 | 3.7 |

TABLE 3

|  | Experimental example 7 | Experimental example 8 | Comparative experimental example 3 |
| --- | --- | --- | --- |
| Etched amount (nm) of silicon oxide chip | 94.1 | 94.6 | 19.3 |
| Etched amount (nm) of silicon nitride chip | 8.3 | 8.1 | 6.2 |
| Selectivity | 11.3 | 11.7 | 3.1 |

By comparison between the etched amounts of the silicon oxide chips in the experimental examples 1 to 4 and the etched amount of the silicon oxide chip in the comparative experimental example 1, the etched amounts of the silicon oxide chips in the experimental examples 1 to 4 are greater than the etched amount of the silicon oxide chip in the comparative experimental example 1. From this result, according to the experimental examples 1 to 4 as exemplary experimental examples of the method MT, it is possible to continuously etch a region formed of silicon oxide. Further, by comparison between the selectivities in the experimental examples 1 to 4 and the selectivity in the comparative experimental example 1, the selectivities in the experimental examples 1 to 4 are increased. From this result, according to the experimental examples 1 to 4 as the exemplary experimental examples of the method MT, it is possible to improve a selectivity.

Further, the experimental examples 5 and 6 are experimental examples in which a kind of a fluorocarbon gas is changed from that in the experimental examples 1 to 4, and the comparative experimental example 2 is an experimental example in which a kind of a fluorocarbon gas is changed from that in the comparative experimental example 1. A result of the comparison between the experimental examples 5 and 6 and the comparative experimental example 2 is the same as the result of the comparison between the experimental examples 1 to 4 and the comparative experimental example 1. That is, according to the experimental examples 5 and 6 as exemplary experimental examples of the method MT, even if a kind of a fluorocarbon gas is changed, it is possible to continuously etch a region formed of silicon oxide and also possible to improve a selectivity.

Furthermore, the experimental examples 7 and 8 are experimental examples in which a high frequency power and a high frequency bias power are changed from those in the experimental examples 1 to 4, and the comparative experimental example 3 is an experimental example in which a high frequency power and a high frequency bias power are changed from those in the comparative experimental example 1. A result of the comparison between the experimental examples 7 and 8 and the comparative experimental example 3 is the same as the result of the comparison between the experimental examples 1 to 4 and the comparative experimental example 1. That is, according to the experimental examples 7 and 8 as exemplary experimental examples of the method MT, even if a high frequency power and a high frequency bias power are changed, it is possible to continuously etch a region formed of silicon oxide and also possible to improve a selectivity.

Experimental Example 9

In the experimental example 9, the same wafer as that of the experimental example 1 is prepared. A process is performed to the wafer under processing conditions to be described below. That is, in the experimental example 9, an oxygen gas (O₂ gas) is not supplied in the process ST2. Further, in the experimental example 9, the repetition number of the process ST1 and the process ST2 serves as a variable parameter. That is, in the experimental example 9, the total processing time for repetition of the process ST1 and the process ST2 is set to be a variable parameter.

Figure 7:
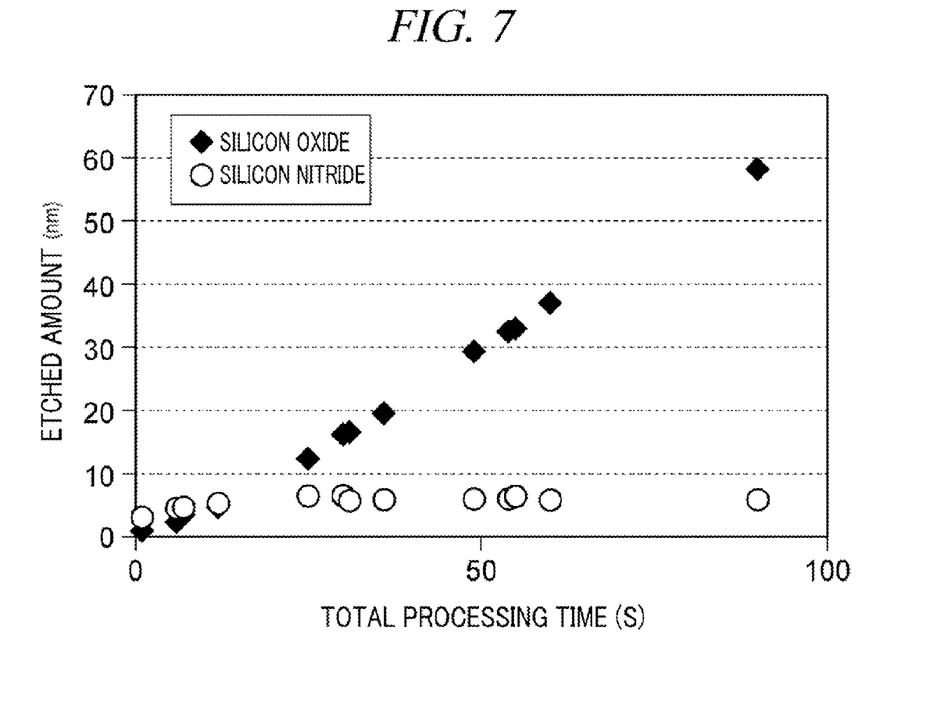
FIG. 7 is a graph illustrating a result obtained from an experimental example 9.

<Processing Conditions>
Process ST1
$C_4F_6$ gas flow rate: 16 sccm
Ar gas flow rate: 1000 sccm
$O_2$ gas flow rate: 10 sccm
High frequency power from first high frequency power supply 62: 40 MHz, 500 W
High frequency bias power from second high frequency power supply 64: 13 MHz, 100 W
DC voltage from power supply 70: −300 V
Processing time: 1 second
Process ST2
$C_4F_6$ gas flow rate: 0 sccm
Ar gas flow rate: 1000 sccm
$O_2$ gas flow rate: 0 sccm
High frequency power from first high frequency power supply 62: 40 MHz, 500 W
High frequency bias power from second high frequency power supply 64: 13 MHz, 100 W
DC voltage from power supply 70: −300 V
Processing time: 5 seconds FIG. 7 shows a graph showing a result obtained from the experimental example 9. FIG. 7 shows an etched amount of a silicon oxide chip, i.e., an etched amount of silicon oxide, and an etched amount of a silicon nitride chip, i.e., an etched amount of silicon nitride. In FIG. 7, a horizontal axis represents a total processing time, and a vertical axis represents an etched amount. As shown in FIG. 7, according to the result from the experimental example 9, as the total processing time increases, the etched amount of the silicon oxide chip increases and the etched amount of the silicon nitride chip is kept constant at a small value. That is, from the experimental example 9, it is found that a high selectivity is obtained. By way of example, since a process is performed for 60 seconds, which is the total processing time, in the experimental example 9, a selectivity of 6.4 is obtained. The selectivity in the experimental example 9 is higher than the selectivities in the experimental examples 1 to 4. Accordingly, it is found that the higher selectivity can be obtained without supplying the oxygen gas in the process ST2.

Various example embodiments have been described above, but various modifications can be made without being limited to the above-described example embodiments. By way of example, in the above descriptions, the capacitively coupled plasma processing apparatus 10 is illustrated as a plasma processing apparatus which can be used for performing the method MT, but a plasma processing apparatus using a certain plasma source can be used for performing the method MT. By way of example, various plasma processing apparatuses, e.g., an inductively coupled plasma processing apparatus and a plasma processing apparatus using a surface wave, e.g., a microwave, as a plasma source can be used for performing the method MT.

Other inventive effects or modification examples may be easily conceived by those skilled in the art. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An etching method of etching a first region formed of silicon oxide, the etching method comprising:
    an exposing process of exposing a target object including the first region and a second region formed of silicon nitride to plasma of a processing gas containing a fluorocarbon gas, etching the first and second regions, and forming a deposit containing fluorocarbon on the first and second regions;
    a modified region forming process of forming a modified region of the deposit on the second region by colliding active species generated from the fluorocarbon gas with the second region; and
    an etching process of etching the first region with a radical of the fluorocarbon contained in the deposit by exposing the target object to plasma of a gas containing a rare gas,
    wherein the exposing process of exposing the target object to the plasma of the processing gas containing the fluorocarbon gas and the etching process of etching the first region with the radical of the fluorocarbon are alternately repeated.

2. The etching method of claim 1,
    wherein the fluorocarbon gas is not supplied in the etching process of etching the first region with the radical of the fluorocarbon.

3. The etching method of claim 1,
    wherein the exposing process of exposing the target object to the plasma of the processing gas containing the fluorocarbon gas and the etching process of etching the first region with the radical of the fluorocarbon are performed in a capacitively coupled plasma processing apparatus including an upper electrode,
    the upper electrode has an electrode plate made of silicon,
    the upper electrode is connected to a power supply configured to apply a voltage for attracting positive ions to the electrode plate, and
    the voltage is applied to the upper electrode in at least one of the exposing process of exposing the target object to the plasma of the processing gas containing the fluorocarbon gas and the etching process of etching the first region with the radical of the fluorocarbon.

* * * * *